United States Patent
Cheng et al.

(10) Patent No.: US 10,791,253 B2
(45) Date of Patent: Sep. 29, 2020

(54) IMAGING BACKPLATE, IMAGING DEVICE AND ELECTRONIC APPARATUS

(71) Applicant: BOE TECHNOLOGY GROUP CO., LTD., Beijing (CN)

(72) Inventors: Chihjen Cheng, Beijing (CN); Xiaoliang Ding, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 16/102,154

(22) Filed: Aug. 13, 2018

(65) Prior Publication Data
US 2019/0098183 A1 Mar. 28, 2019

(30) Foreign Application Priority Data
Sep. 27, 2017 (CN) .......................... 2017 1 0890495

(51) Int. Cl.
*H04N 5/225* (2006.01)
*G06F 9/00* (2006.01)
*H01L 27/146* (2006.01)
*G06F 3/041* (2006.01)
*G06K 9/00* (2006.01)

(52) U.S. Cl.
CPC ........... *H04N 5/2253* (2013.01); *G06F 3/041* (2013.01); *G06K 9/0004* (2013.01); *H01L 27/1461* (2013.01); *H01L 27/14618* (2013.01); *H01L 27/14678* (2013.01); *H04N 5/2254* (2013.01)

(58) Field of Classification Search
CPC .. H04N 5/2253; H04N 5/2254; H04N 5/2251; H01L 27/14678; H01L 27/14618; H01L 27/1461; G06K 9/0004; G06F 3/041
USPC .......................................................... 345/173
See application file for complete search history.

(56) References Cited

U.S. PATENT DOCUMENTS

2008/0121442 A1* 5/2008 Boer .................... G06F 3/0421
                                                         178/18.09
2008/0174709 A1    7/2008 Lim et al.
(Continued)

FOREIGN PATENT DOCUMENTS

| CN | 106773273 A | 5/2017 |
|---|---|---|
| CN | 106873284 A | 6/2017 |
| JP | 2008165242 A | 7/2008 |

OTHER PUBLICATIONS

First Chinese Office Action dated Sep. 12, 2019, received for corresponding Chinese Chinese Application No. 201710890495.3?

*Primary Examiner* — Chineyere D Wills-Burns
(74) *Attorney, Agent, or Firm* — Kinney & Lange, P.A.

(57) ABSTRACT

An imaging backplate, an imaging device and an electronic apparatus are provided. The imaging backplate is used in a pinhole-imaging-based apparatus and includes a plate body, a plurality of photosensitive sensors, and a plurality of pixel circuits. The plate body is divided into a plurality of illumination subregions and a non-illumination region beyond the plurality of illumination subregions, the plurality of photosensitive sensors is in the plurality of illumination subregions and arranged in matrix, and the plurality of pixel circuits is arranged in the non-illumination region. Each of the plurality of photosensitive sensors is in a corresponding one of the plurality of illumination subregions and is connected to a corresponding one of the plurality of pixel circuits.

8 Claims, 2 Drawing Sheets

(56) References Cited

U.S. PATENT DOCUMENTS

| | | | |
|---|---|---|---|
| 2013/0120760 A1* | 5/2013 | Raguin | G06K 9/0004 356/612 |
| 2015/0109214 A1* | 4/2015 | Shi | G06F 3/044 345/173 |
| 2016/0132712 A1* | 5/2016 | Yang | G06F 3/044 348/77 |
| 2017/0076133 A1* | 3/2017 | Hillmann | G06T 5/009 |
| 2017/0091506 A1* | 3/2017 | Sinha | G06F 21/32 |
| 2017/0124370 A1* | 5/2017 | He | G06K 9/0002 |
| 2017/0220844 A1* | 8/2017 | Jones | H01L 27/3234 |
| 2018/0005007 A1* | 1/2018 | Du | H01L 27/3262 |
| 2018/0012069 A1* | 1/2018 | Chung | G06K 9/0012 |

\* cited by examiner

IMAGING BACKPLATE, IMAGING DEVICE AND ELECTRONIC APPARATUS

CROSS-REFERENCE TO RELATED APPLICATION

The present application claims a priority of a Chinese patent application No. 201710890495.3 filed in China on Sep. 27, 2017, the disclosure of which is incorporated herein by reference in its entirety.

BACKGROUND

The present disclosure relates generally to the field of imaging technology, and more specifically to an imaging backplate, an imaging device, and an electronic apparatus.

With development of an imaging technology, an imaging technology based on the pinhole imaging principle is widely applied in an imaging technology needing an accuracy. Electronic devices such as a camera, a slide projector and a fingerprint recognition device have used the pinhole imaging principle.

In an imaging process, an object having a certain brightness is imaged on an imaging backplate through a plurality of pinholes, wherein the imaging backplate includes a plurality of pixel units arranged in a matrix, each of the pixel units includes a photosensitive sensor and a pixel circuit; light from the object is illuminated on the pixel units though the pinholes, and photosensitive sensors in the pixel units receive the light and obtain imaging information of the object. In actual applications, such an arrangement wastes spaces on the imaging backplate, causing an inefficient layout on the imaging backplate.

SUMMARY

The present disclosure provides an imaging backplate, an imaging device and an electronic apparatus.

In a first aspect, the present disclosure provides an imaging backplate used in a pinhole-imaging-based device. The imaging backplate includes a plate body, divided into a plurality of illumination subregions independent from each other and a non-illumination region beyond the plurality of illumination subregions; a plurality of photosensitive sensors, in the plurality of illumination subregions and arranged in matrix; and a plurality of pixel circuits, in the non-illumination region, wherein each of the plurality of photosensitive sensors is in a corresponding one of the plurality of illumination subregions and is connected to a corresponding one of the plurality of pixel circuits.

Optionally, there is a distance between edges of every two adjacent illumination subregions of the plurality of illumination subregions, and a shape of each of the plurality of illumination subregions is a circle.

Optionally, each of the plurality of pixel circuits includes a thin film transistor.

In a second aspect, the present disclosure provides an imaging device. The imaging device includes a pinhole component having a plurality of pinholes, and the imaging backplate according to the first aspect, wherein the pinhole component is opposite to the imaging backplate, the plurality of pinholes is arranged to correspond to the plurality of illumination subregions of the imaging backplate, respectively and is configured to image an object having a brightness onto the plurality of illumination subregions.

Optionally, the imaging device further includes a light-emission layer, opposite to the pinhole component, wherein the pinhole component is between the light-emission layer and the imaging backplate, and a distance between the light-emission layer and the pinhole component is larger than that between the pinhole component and the imaging backplate, the light-emission layer includes a plurality of light-emission regions, the plurality of light-emission regions is arranged to correspond to the plurality of pinholes, respectively, and the plurality of light-emission regions is configured to emit light to be illuminated on the object so that the object having a brightness is imaged on the plurality of illumination subregions through the plurality of pinholes.

Optionally, each of the plurality of light-emission regions corresponds to one of the plurality of pinholes; each of the plurality of light-emission regions illuminates a part of the object so that the part of the object is imaged through one of the plurality of pinholes corresponding to the light-emission region on one of the plurality of illumination subregions corresponding to the pinhole.

Optionally, every two adjacent light-emission regions of the plurality of light-emission regions have an overlapped region.

Optionally, each of the plurality of pinholes is a circular pinhole, a shape of each of the plurality of light-emission regions is a circle, and a shape of each of the plurality of illumination subregions is a circle.

Optionally, a diameter of each of the plurality of light-emission regions is c, a diameter of each of the plurality of illumination subregions is d, a distance between the light-emission layer and the pinhole component is u, a distance between the pinhole component and the imaging backplate is v, and $c/u=d/v$, wherein c, u, d and v are positive numbers.

Optionally, a line in which a center of each of the plurality of pinholes and a center of one of the plurality of illumination subregions corresponding to the pinhole are located, is perpendicular to the pinhole component.

Optionally, the imaging device further includes: a touch panel, at a side of the light-emission layer away from the pinhole component.

In a third aspect, the present disclosure further provides an electronic apparatus including the imaging device according to the second aspect.

DETAILED DESCRIPTION

The present disclosure will be described hereinafter in combination with accompanying figures and embodiments.

Figure 1:
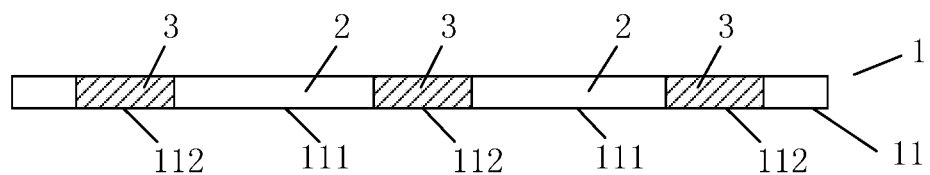
FIG. 1 is a structural schematic diagram of an imaging backplate in some embodiments of the present disclosure.
Figure 2:
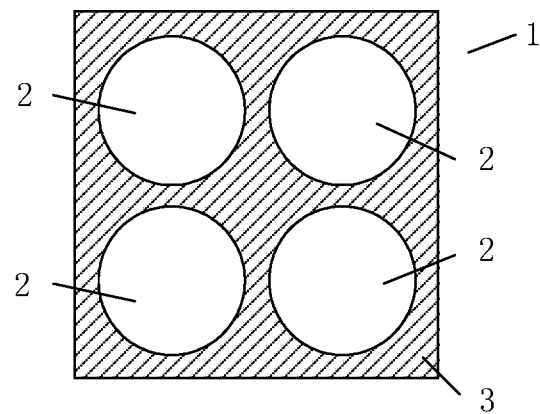
FIG. 2 is a top view of the imaging backplate of FIG. 1.

FIG. 1 is a structural schematic diagram of an imaging backplate in some embodiments of the present disclosure; and FIG. 2 is a top view of FIG. 1. As shown in FIG. 1 and FIG. 2, some embodiments of the present disclosure provide an imaging backplate 1. The imaging backplate 1 is used in a device based on the pinhole imaging principle. The imaging backplate 1 includes a backplate body 11, a plurality of photosensitive sensors 2 and a plurality of pixel circuits. The backplate body 11 is divided into an illumination region 111 and a non-illumination region 112. Each of the plurality of photosensitive sensors 2 is connected to one of the plurality of pixel circuits 3. Such connection may be a direct, indirect, electrical or mechanical connection. The plurality of photosensitive sensors 2 is arranged in the illumination region 111, and the plurality of pixel circuits 3 is arranged in the non-illumination region 112.

Figure 3:
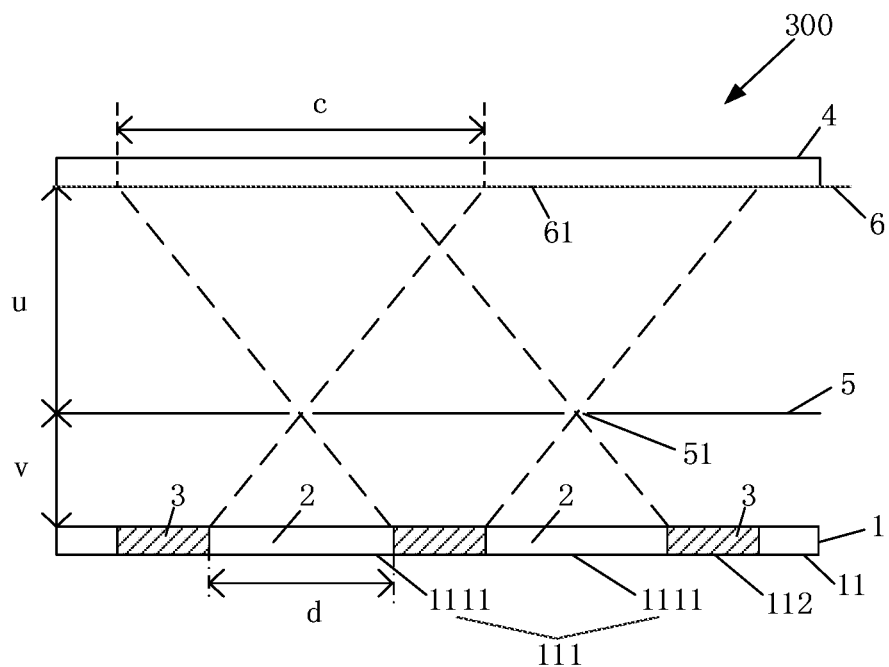
FIG. 3 is a structural schematic diagram of an imaging device according to one embodiment of the present disclosure.

FIG. 3 is a structural schematic diagram of an imaging device in some embodiments of the present disclosure. As shown in FIG. 3, the imaging backplate 1 is applied in a device based on the pinhole imaging principle. A object 4 having a certain brightness is imaged in the illumination region 111 through a plurality of pinholes 51. The plurality of photosensitive sensors 2 is arranged in the illumination region 111. Light reflected by the object 4 is all received by the plurality of photosensitive sensors 2. The plurality of photosensitive sensors 2 transforms the received light to electrical signals. The plurality of pixel circuits 3 sends the electrical signals to external circuits for analysis, so as to obtain image information of the object 4.

The plurality of photosensitive sensors 2 is arranged to be separated from the plurality of pixel circuits 3. As compared with an arrangement in the related art in which light is illuminated on a region having the photosensitive sensors 2 and the pixel circuits 3, light is only illuminated on the photosensitive sensors 2 in the illumination region 111 in some embodiments of the present disclosure, but is not illuminated on the pixel circuits 3 in the non-illumination region 112. In this way, a quantity of pixels per unit area in an optical image of the object 4 received by the photosensitive sensors 2 is increased, and thus the optical image of the object 4 is more clear. Under a premise of assuring resolution, the pinholes 51 may also be closer to the imaging backplate 1, so that an area of the light illuminated on the imaging backplate 1 is smaller and a size of the illumination region 111 of the imaging backplate 1 may be shrunken, and a size of the backplate body 11 of the imaging backplate 1 may be shrunken accordingly. Thus, a spare space for arranging other components of the imaging device may be formed around the backplate body 1, or the size of the backplate body 11 is not changed and a spare space for arranging other components may be formed on the backplate body 11. In this way, a rate of utilizing space on the imaging backplate may be enhanced and a structural layout of the imaging backplate 1 may be optimized.

Some embodiments of the present disclosure provide an imaging backplate. The imaging backplate is used in a device based on the pinhole imaging principle. In the imaging backplate, a plurality of photosensitive sensors is arranged to be separated from a plurality of pixel circuits, so that the light reflected by the object is all illuminated on the photosensitive sensors, but not illuminated on the pixel circuits arranged in the non-illumination region. Thus, the quantity of photosensitive sensors covered by the light through the pinholes is increased, and the quantity of pixels per unit area in the optical image of the object received is increased, and thus a resolution of the optical image is enhanced. Under a premise of assuring the resolution, the illumination region may be shrunken so as to spare more space to accommodate other components and the rate of utilizing space on the imaging backplate is improved. The problem of wasting space on the imaging backplate may be solved, and the structural layout of the imaging backplate is optimized. Further, because the plurality of photosensitive sensors is arranged to be separated from the plurality of pixel circuits, an uniformity of the photosensitive sensors and an uniformity of the pixel circuits are improved.

Specifically, the pixel circuits 3 include thin film transistors (TFT). Each of the pixel circuits 3 includes one thin film transistor. The pixel circuit formed of the thin film transistor and other components may be an active circuit or a passive circuit arranged in the non-illumination region of the imaging backplate. When providing a signal to a gate electrode of the thin film transistor, the thin film transistor may be controlled to be switched on, so that the pixel circuit 3 is turned on. The photosensitive transistor 2 transforms received light to an electrical signal and the pixel circuit 3 sends the electrical signal to external circuits for analysis. Thus, the image information of the object is obtained. By arranging the thin film transistors in the non-illumination region 112, influence on the thin film transistors from the light may be prevented, no additional light shielding layer is needed, and thus a design of the imaging backplate is simplified and the structural layout of the imaging backplate is optimized.

As shown in FIG. 3, some embodiments of the present disclosure provides an imaging device 300. The imaging device 300 includes the pinhole component 5 having a plurality of pinholes formed therein, and the above imaging backplate 1. The pinhole component 5 is opposite to the imaging backplate 1. Projections of the pinholes 51 on the imaging backplate 1 correspond to the illumination region 111 of the imaging backplate 1, so that the object having a certain brightness may be imaged on the illumination region 111.

The pinhole component 5 may be formed as a plate having the pinholes 51 therein, and the plate is not light transmissible (i.e., opaque). The imaging backplate 1 is opposite to the pinhole component 5 so that the projections of the pinholes 51 on the imaging backplate 1 correspond to the illumination region 111. A structure of the imaging backplate 1 and an operational principle that the imaging backplate 1 cooperates with the pinhole component 5 to realize a pinhole imaging process are the same as the above embodiments, and thus are not repeated herein. The imaging device may be applied in fingerprint recognition, slide projection, photographing, or the like.

In the imaging device provided in some embodiments of the present disclosure, the imaging backplate is opposite to the pinhole component. When realizing the pinhole imaging process by using the pinhole component, the object having a certain brightness is imaged in the illumination region through the pinholes. By arranging the plurality of photosensitive sensors to be separated from the plurality of pixel circuits, the light reflected by the object is all illuminated on the photosensitive sensors, but not illuminated on the pixel circuits arranged in the non-illumination region. Thus, the quantity of photosensitive sensors covered by the light through the pinholes is increased, and the quantity of pixels per unit area in the optical image of the object is increased, and thus the resolution of the optical image is enhanced. Under a premise of assuring the resolution, the illumination region may be shrunken so as to spare more space to accommodate other components and the rate of utilizing space in the imaging backplate is improved. The problem of wasting space on the imaging backplate may be solved, and the structural layout of the imaging backplate is optimized. Further, because the plurality of photosensitive sensors is arranged to be separated from the plurality of pixel circuits, an uniformity of the photosensitive sensors and an uniformity of the pixel circuits are improved.

Further, the above imaging device 300 further includes a light-emission layer 6. The light-emission layer 6 is opposite to the pinhole component 5. The pinhole component 5 is between the light-emission layer 6 and the imaging backplate 1. The light-emission layer 6 includes a plurality of light-emission regions 61. The light-emission regions 61 correspond to the pinholes 51. Projections of the pinholes 51 on the light-emission layer 6 correspond to the light-emission regions 61. A distance between the light-emission layer 6 and the pinholes 51 is larger than that between the pinholes 51 and the imaging backplate 1, and the light-emission region 61 is configured to emit light for illuminating the object 4, so that the object 4 having a certain brightness may be imaged in the illumination region 111.

A distance between the object 4 and the pinholes 51 is the object distance u, and a distance between the pinholes 51 and the imaging backplate 1 is the image distance v. According to the pinhole imaging principle, a size of an object "c" dividing the object distance "u" equals to a size of an image "d" dividing the image distance "v", i.e., $c/u=d/v$. When performing an imaging operation, the object distance "u" should be larger than the image distance "v". When performing the pinhole imaging process of the object, the object 4 is arranged at a side of the light-emission layer 6 away from the pinhole component 5. Light emitted from the light-emission regions 61 faces towards the object 4, and the distance between the light-emission layer 6 and the pinholes 51 should be larger than the distance between the pinholes 51 and the imaging backplate 1. When the light emitted from the light-emission regions 61 illuminates the object 4, the object 4 reflects the light, and the reflected light is illuminated on the illumination region 111 of the imaging backplate 1 through the pinholes 51 to form an image of the object 4. The illumination region 111 is surrounded by the non-illumination region 112, and the pixel circuits 3 are in the non-illumination region 112. The structural layout of the imaging backplate is optimized. The light-emission layer 6 may facilitate the pinhole imaging process of the object 4 in a dark environment and a clear image of the object 4 may be obtained.

The imaging device includes a plurality of light-emission regions 61 and a plurality of pinholes 51. Each of the plurality of light-emission regions 61 corresponds to one of the plurality of pinholes 51. The illumination region 111 of the imaging backplate 1 includes a plurality of illumination subregions independent from each other. The plurality of photosensitive sensors 2 is arranged in the plurality of illumination subregion 1111, respectively, and each of the plurality of illumination subregions 1111 corresponds to one of the plurality of pinholes 51, each of the plurality of light-emission regions 61 is configured to illuminate a part of the object 4, so that each part of the object 4 may be imaged on a corresponding one of the plurality of illumination subregions 1111 through a corresponding one of the plurality of pinholes 51. Each of various parts of the object 4 is imaged on a corresponding one of the plurality of light-emission subregions 1111 through a corresponding one of the plurality of pinholes 51. A photosensitive sensor 2 in the corresponding light-emission subregion 1111 receives light from the part of the object 4, transforms the light to an electrical signal, and a pixel circuit 3 corresponding to the photosensitive sensor 2 in the non-illumination region 112 sends the electrical signal to the external circuits for analysis (for example, performing a splicing calculation), so as to obtain the image information regarding an entirety of the object 4. This way of imaging the various parts of the object may image the object more accurately and save a space designed for the illumination region, and the pixel circuits 3 may be flexibly arranged in the non-illumination region, thereby optimizing the structural layout of the imaging backplate.

Optionally, every two adjacent light-emission regions 61 of the plurality of light-emission regions have an overlapped region. A size of each of the plurality of light-emission regions 61 may be the above size "c" of the object, a size of each of the plurality of illumination subregions 1111 may be the above size "d" of the image, and the above relation "$c/u=d/v$" is met. The overlapped region of every two adjacent light-emission regions 61 may ensure that obtained images of the various parts of the object 4 have overlapped regions. Thus, an entirety of the object 4 may be ensured to be imaged, thereby enhancing an accuracy of the obtained image.

Specifically, a shape of each of the light-emission regions 61 may be a rectangular, a circle, or the like. A shape of each of the plurality of illumination subregions 1111 may be a circle or a square.

Optionally, every two adjacent illumination subregions 1111 of the plurality of illumination subregions 1111 have a gap therebetween. That is, every two adjacent illumination subregions 1111 of the plurality of illumination subregions 1111 are independent from each other, there is a distance between edges of every two adjacent illumination subregions 1111, and the edges of every two adjacent illumination subregions 1111 are not tangent (do not contact with each other). The distance between the edges of every two adjacent illumination subregions 1111 may be adjusted by setting the distance "v" between the pinhole component 5 and the imaging backplate 1, so that under a premise of ensuring accurate imaging of the object, the sizes of the illumination subregions may be shrunken, and the rate of utilizing space on the imaging backplate 1 may be further enhanced, and the structural layout of the imaging backplate 1 is optimized.

As shown in FIGS. 2 and 3, a shape of each of the pinholes 51 may be a circle or a square. When the shape of each of the pinholes is a circle, a shape of the light illuminated on the imaging backplate 1 through the pinholes 51 is a circle, and the illumination subregions 1111 may be designed to be circular. Since the surrounding of a circle is relatively large, an area of the non-illumination region 112 may be enlarged, and thus spaces on the imaging backplate 1 may be more sufficiently utilized, and the structural layout of the imaging backplate 1 may be optimized.

Optionally, when the shape of each of the pinholes 51 is a circle, the shape of each of the illumination subregions 1111 is a circle. When the shape of each of the light-emission regions 61 is a circle, the line in which the center of one pinhole 51 and the illumination subregion 1111 corresponding to the pinhole 51 are located is perpendicular to the pinhole component.

Figure 4:
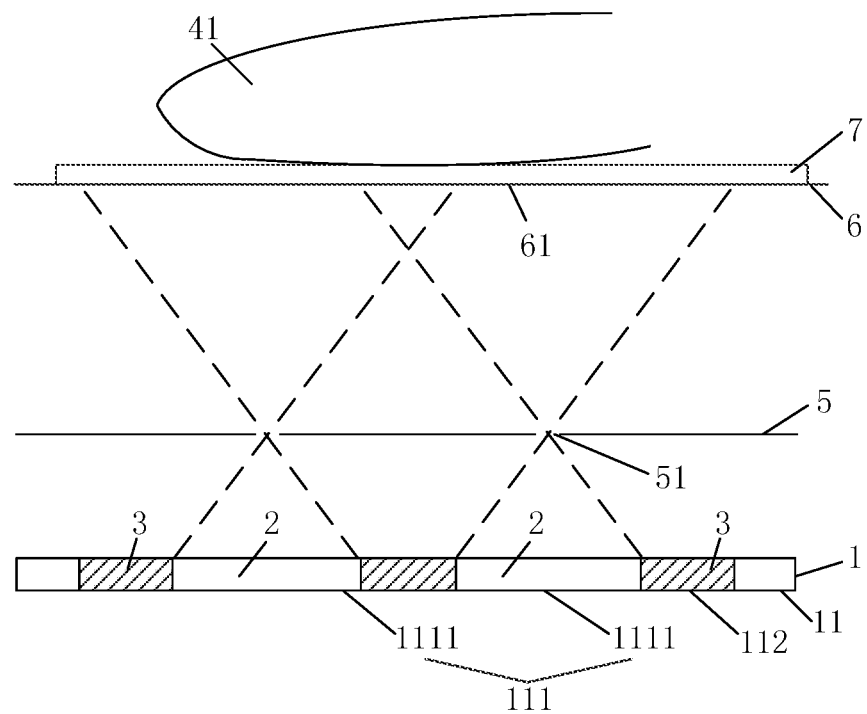
FIG. 4 is another structural schematic diagram of an imaging device according to one embodiment of the present disclosure.

Further, FIG. 4 is another structural schematic diagram of an imaging device in some embodiments of the present disclosure. As shown in FIG. 4, the imaging device further includes a touch panel 7. The touch panel 7 is at a side of the light-emission layer 6 away from the pinhole component 5. When the touch panel 7 is arranged at a side of the light-emission layer 6 away from the pinhole component 5, the imaging device may be used in fingerprint recognition. When a finger 41 touches the touch panel 7, light emitted from the illumination layer 6 is incident on the finger 41, the light incident on the finger 41 is reflected by the finger 41 and illuminated on the illumination region 111 of the imaging backplate 1 through the pinholes 51. The photosensitive sensors 2 receive the light and transform the light to electrical signals, and the pixel circuits 3 in the non-illumination region 112 sends the electrical signals to the external circuits for analysis. Thus, the image information of the fingerprint is obtained, and the fingerprint recognition is finished.

In the imaging device according to some embodiments of the present disclosure, the photosensitive sensors are separated from the pixel circuits on the imaging backplate, so that the quantity of photosensitive sensors covered by the light passing through the pinholes is more, and thus, the quantity of pixels per unit area in the obtained image of the object is more. Thus, a resolution of the obtained image is increased. Under a premise of assuring the resolution, the illumination region may be shrunken so as to spare more space to accommodate other components and the rate of utilizing space on the imaging backplate is improved. The structural layout of the imaging backplate is optimized. Further, because the plurality of photosensitive sensors is arranged to be separated from the plurality of pixel circuits, an uniformity of the photosensitive sensors and an uniformity of the pixel circuits are improved.

Some embodiments of the present disclosure further provide an electronic apparatus which includes the above imaging device.

As shown in FIGS. 1-4, the imaging device utilizes the pinhole imaging principle, and may be applied in electronic apparatuses utilizing fingerprint recognition, slide projection, photographing, or the like. A structure and a principle of the imaging device are the same as the above embodiments, and detailed description thereof is not repeated.

The electronic apparatus according to some embodiments of the present disclosure includes the imaging device utilizing the pinhole imaging principle. Since the photosensitive sensors are separated from the pixel circuits on the imaging backplate, the light reflected by the object to be imaged is all illuminated on the photosensitive sensors, but not illuminated on the pixel circuits in the non-illumination region, so that the quantity of photosensitive sensors covered by the light passing through the pinholes is more, and thus, the quantity of pixels per unit area in the obtained image of the object is more. Thus, a resolution of the image is increased. Under a premise of assuring the resolution, the illumination region may be shrunken so as to spare more space to accommodate other components and the rate of utilizing space on the imaging backplate is improved. The problem of wasting space on the imaging backplate may be solved, and the structural layout of the imaging backplate is optimized. Further, because the plurality of photosensitive sensors is separated from the plurality of pixel circuits, an uniformity of the photosensitive sensors and an uniformity of the pixel circuits are improved.

The above descriptions are only specific embodiments of the present disclosure. However, the protection scope of the present disclosure is not limited thereto. Any variations or replacements anticipated by those skilled in the art in the technical scope disclosed by the present disclosure will fall into the protection scope of the present disclosure. Thus, the protection scope of the present disclosure should be determined by the claims.

What is claimed is:

1. An imaging device, comprising:
a pinhole component having a plurality of pinholes;
an imaging backplate; and
a light-emission layer, opposite to the pinhole component;
wherein the imaging backplate comprises:
a plate body divided into a plurality of illumination subregions independent from each other and a non-illumination region beyond the plurality of illumination subregions;
a plurality of photosensitive sensors situated in the plurality of illumination subregions and arranged in a matrix; and
a plurality of pixel circuits situated in the non-illumination region;
wherein each of the plurality of photosensitive sensors is in a corresponding one of the plurality of illumination subregions and is directly connected to a corresponding one of the plurality of pixel circuits;
wherein a thickness of the non-illumination region is equal to thicknesses of the plurality of illumination subregions;
wherein an entirety of the plurality of pixel circuits is situated in the non-illumination region and an entirety of each of the plurality of photosensitive sensors is in a corresponding one of the plurality of illumination subregions; and
wherein there is a distance between edges of every two adjacent illumination subregions of the plurality of illumination subregions, and a shape of each of the plurality of illumination subregions is a circle,
wherein the pinhole component is opposite to the imaging backplate, the plurality of pinholes are arranged to correspond to the plurality of illumination subregions of the imaging backplate, respectively, and the pinhole component is configured to image an object having a brightness onto the plurality of illumination subregions;
wherein the pinhole component is between the light-emission layer and the imaging backplate, and a distance between the light-emission layer and the pinhole component is larger than that between the pinhole component and the imaging backplate; and
wherein the light-emission layer comprises a plurality of light-emission regions, the plurality of light-emission regions are arranged corresponding to the plurality of pinholes in a one-to-one manner, and the plurality of light-emission regions are configured to emit light to be illuminated on the object so that the object having a brightness is imaged on the plurality of illumination subregions through the plurality of pinholes.

2. The imaging device according to claim 1, wherein,
each of the plurality of light-emission regions corresponds to one of the plurality of pinholes; and
each of the plurality of light-emission regions illuminates a part of the object so that the part of the object is imaged through one of the plurality of pinholes corresponding to the light-emission region on one of the plurality of illumination subregions corresponding to the pinhole.

3. The imaging device according to claim 2, wherein, every two adjacent light-emission regions of the plurality of light-emission regions have an overlapped region.

4. The imaging device according to claim 2, wherein each of the plurality of pinholes is a circular pinhole, a shape of each of the plurality of light-emission regions is a circle, and a shape of each of the plurality of illumination subregions is a circle.

5. The imaging device according to claim 4, wherein, a diameter of each of the plurality of light-emission regions is c, a diameter of each of the plurality of illumination subregions is d, a distance between the light-emission layer and the pinhole component is u, a distance between the pinhole component and the imaging backplate is v, and $c/u=d/v$, wherein c, u, d and v are positive numbers.

6. The imaging device according to claim 5, wherein, a center of each of the plurality of pinholes and a center of one of the plurality of illumination subregions corresponding to the pinhole are located in a line, and the line is perpendicular to the pinhole component.

7. The imaging device according to claim 1, further comprising:
   a touch panel, at a side of a light-emission layer away from the pinhole component.

8. An electronic apparatus, comprising:
   the imaging device according to claim 1.

* * * * *